(12) United States Patent
Matsudo et al.

(10) Patent No.: US 12,191,124 B2
(45) Date of Patent: Jan. 7, 2025

(54) PLASMA PROCESSING APPARATUS AND PLASMA PROCESSING METHOD (71) Applicant: TOKYO ELECTRON LIMITED, Tokyo (JP)

(72) Inventors: Tatsuo Matsudo, Yamanashi (JP); Yasushi Morita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 18/022,921

(22) PCT Filed: Aug. 24, 2021

(86) PCT No.: PCT/JP2021/031028
§ 371 (c)(1),
(2) Date: Feb. 23, 2023

(87) PCT Pub. No.: WO2022/050136
PCT Pub. Date: Mar. 10, 2022

(65) Prior Publication Data
US 2023/0307215 A1 Sep. 28, 2023

(30) Foreign Application Priority Data
Sep. 7, 2020 (JP) .................................. 2020-149731

(51) Int. Cl.
C23C 16/505 (2006.01)
C23C 16/52 (2006.01)
H01J 37/32 (2006.01)

(52) U.S. Cl.
CPC ...... H01J 37/32834 (2013.01); C23C 16/505 (2013.01); C23C 16/52 (2013.01);
(Continued)

(58) Field of Classification Search
CPC ...... C23C 16/505; C23C 16/509; C23C 16/52
See application file for complete search history.

(56) References Cited

U.S. PATENT DOCUMENTS 7,019,543 B2 * 3/2006 Quon ............... H01J 37/321
324/464
11,403,654 B2 * 8/2022 Gupta ............. G06Q 30/0204
(Continued)

FOREIGN PATENT DOCUMENTS

| JP | 2001-267310 A | 9/2001 |
| JP | 2003-179054 A | 6/2003 |
| WO | WO 01/69642 A2 | 9/2001 |

OTHER PUBLICATIONS

Zanaska, M., et al., "In-situ impedance spectroscopy of a plasma-semiconductor thin film system during reactive sputter deposition". J. Appl. Phys. 126, 023301 (2019) pp. 1-12.*
(Continued)

Primary Examiner — Bret P Chen
(74) Attorney, Agent, or Firm — Fenwick & West LLP (57) ABSTRACT There is provided a plasma processing apparatus comprising: a chamber; a gas supply configured to supply a gas into the chamber; an exhaust device configured to exhaust a gas in the chamber; a substrate support including a lower electrode and provided in the chamber; an upper electrode provided above the substrate support; a high-frequency power supply configured to supply high-frequency power to the upper electrode; an impedance circuit connected between the lower electrode and ground; and a controller configured to control the gas supply and the exhaust device such that a pressure of the gas in the chamber is 26.66 Pa or higher. A frequency of the high-frequency power is lower than 13.56 MHz, and an impedance of the impedance circuit is set such that an impedance of an electrical path from the lower electrode through the impedance circuit to the ground is higher than an impedance of an electrical path from a wall of the chamber to the ground.

16 Claims, 7 Drawing Sheets (52) U.S. Cl.
CPC .. *H01J 37/32082* (2013.01); *H01J 37/32449* (2013.01); *H01J 37/32541* (2013.01); *H01J 37/32568* (2013.01); *H01J 37/32577* (2013.01); *H01J 2237/182* (2013.01); *H01J 2237/24564* (2013.01); *H01J 2237/332* (2013.01)

(56) References Cited

U.S. PATENT DOCUMENTS

| | | | | |
|---|---|---|---|---|
| 2002/0038688 | A1* | 4/2002 | Nakano | H01J 37/32165 156/345.12 |
| 2004/0244688 | A1* | 12/2004 | Himori | H01L 21/31138 257/E21.252 |
| 2008/0026488 | A1* | 1/2008 | Panda | H01J 37/32935 156/345.45 |
| 2009/0165954 | A1* | 7/2009 | Kuthi | H01J 37/32623 156/345.43 |
| 2011/0287631 | A1* | 11/2011 | Yamamoto | H01J 37/32577 438/758 |
| 2020/0185193 | A1* | 6/2020 | Koshimizu | H01J 37/32577 |

OTHER PUBLICATIONS

Sobolewski, M.A., et al., "Electrical optimization of plasma-enhanced chemical vapor deposition chamber cleaning plasmas". J. Vac. Sci. Technol. B 16(1), Jan./Feb. 1998, pp. 173-182.*

Hornsveld, N., et al., "Plasma-assisted and thermal atomic layer deposition of electrochemically active Li2CO3". RSC Adv., 2017, 7, 41359-41368.*

PCT International Search Report and Written Opinion, PCT Application No. PCT/JP2021/031028, Oct. 26, 2021, 8 pages (with English translation of PCT International Search Report and Written Opinion).

* cited by examiner

PLASMA PROCESSING APPARATUS AND PLASMA PROCESSING METHOD

TECHNICAL FIELD

An exemplary embodiment of the present disclosure relates to a plasma processing apparatus and a plasma processing method.

BACKGROUND

A capacitively coupled plasma processing apparatus is used in plasma processing such as film formation processing. A capacitively coupled plasma processing apparatus includes a chamber, a substrate support, an upper electrode, a gas supply, an exhaust device, and a high-frequency power supply. The substrate support includes a lower electrode and is provided in the chamber. The upper electrode is provided above the lower electrode. The gas supply and the exhaust device are connected to the chamber. The high-frequency power supply is connected to the upper electrode.

When plasma processing is performed, the high-frequency power is supplied from the high-frequency power supply to the upper electrode while a gas is being supplied from the gas supply into the chamber. As a result, a plasma is generated from the gas in the chamber. A substrate on the substrate support is processed by chemical species from the generated plasma. For example, a film is formed on the substrate.

Patent Documents 1 and 2 disclose such capacitively coupled plasma processing apparatuses.

PRIOR ART DOCUMENTS

Patent Documents

Patent Document 1: Japanese Laid-open Patent Publication No. 2001-267310
Patent document 2: Japanese Laid-open Patent Publication No. 2003-179054

SUMMARY

Problems to be Resolved by the Invention

The present disclosure provides a technique for generating a high-density plasma in a high-pressure chamber and reducing energy applied to a substrate.

Means of Solving the Problems

In one exemplary embodiment, a plasma processing apparatus is provided. The plasma processing apparatus comprises a chamber, a gas supply, an exhaust device, a substrate support, an upper electrode, a high-frequency power supply, an impedance circuit, and a controller. The gas supply is configured to supply a gas into the chamber. The substrate support includes a lower electrode and is provided in the chamber. The upper electrode is provided above the substrate support. The high-frequency power supply is configured to supply high-frequency power to the upper electrode. The impedance circuit is connected between the lower electrode and ground. The controller controls the gas supply and the exhaust device such that a pressure of the gas in the chamber is 26.66 Pa (200 mTorr) or higher. A frequency of the high-frequency power is lower than 13.56 MHz. An impedance of the impedance circuit is set such that an impedance of an electrical path from the lower electrode through the impedance circuit to the ground is higher than an impedance of an electrical path from a wall of the chamber to the ground.

Effect of the Invention

In accordance with one exemplary embodiment, it is possible to generate a high-density plasma in a high-pressure chamber and reduce energy applied to a substrate.

DETAILED DESCRIPTION

Various exemplary embodiments are described below.

In one exemplary embodiment, a plasma processing apparatus is provided. The plasma processing apparatus comprises a chamber, a gas supply, an exhaust device, a substrate support, an upper electrode, a high-frequency power supply, an impedance circuit, and a controller. The gas supply is configured to supply a gas into the chamber. The substrate support includes a lower electrode and is provided in the chamber. The upper electrode is provided above the substrate support. The high-frequency power supply is configured to supply high-frequency power to the upper electrode. The impedance circuit is connected between the lower electrode and ground. The controller controls the gas supply and the exhaust device such that a pressure of the gas in the chamber is 26.66 Pa (200 mTorr) or higher. A frequency of the high-frequency power is lower than 13.56 MHz. An impedance of the impedance circuit is set such that an impedance of a first electrical path from the lower electrode through the impedance circuit to the ground is higher than an impedance of a second electrical path from a wall of the chamber to the ground.

Since the plasma processing apparatus of the above embodiment uses the high-frequency power having a frequency lower than 13.56 MHz, it is possible to generate a high-density plasma in a high-pressure chamber of 26.66 Pa (200 mTorr) or higher. Further, electrical coupling between the upper electrode and the lower electrode is weakened by the impedance circuit. Therefore, current flowing through the lower electrode is reduced. Accordingly, energy applied to the substrate on the substrate support is reduced.

In one exemplary embodiment, the plasma processing apparatus may further comprise a ring electrode. The ring electrode has a ring shape and is provided outside a space between the lower electrode and the upper electrode and inside the chamber. The plasma processing apparatus may further comprise a second impedance circuit that is different from a first impedance circuit that is the impedance circuit connected between the lower electrode and the ground. The second impedance circuit is connected between the ring electrode and the ground. An impedance of the second impedance circuit may be set such that an impedance of a third electrical path from the ring electrode through the second impedance circuit to the ground is lower than the impedance of the first electrical path.

In one exemplary embodiment, the plasma processing apparatus may further comprise a current sensor. The current sensor measures a current value in the third electrical path. The controller may set the impedance of the second impedance circuit to maximize the current value measured by the current sensor.

In one exemplary embodiment, the ring electrode may extend along a sidewall of the chamber. In one exemplary embodiment, the ring electrode may extend to surround the upper electrode. In one exemplary embodiment, the ring electrode may extend to surround the substrate support.

In one exemplary embodiment, the frequency of the high-frequency power may be 2 MHz or less.

In one exemplary embodiment, the gas supply may be configured to supply a film forming gas. In other words, the plasma processing apparatus may be a film forming apparatus.

In another exemplary embodiment, a plasma processing method is provided. The plasma processing method comprises (a) preparing a substrate on a substrate support in a chamber of a plasma processing apparatus. The substrate support includes a lower electrode. In the plasma processing apparatus, an impedance circuit is connected between the lower electrode and ground. The plasma processing method further comprise (b) supplying a gas into the chamber. A pressure of the gas in the chamber is set to a pressure of 26.66 Pa (200 mTorr) or higher. The plasma processing method further comprise (c) supplying high-frequency power to an upper electrode. The upper electrode is provided above the substrate support. In a state where the pressure of the gas in the chamber is set to a pressure of 26.66 Pa (200 mTorr) or higher in the (b), the high-frequency power having a frequency lower than 13.56 MHz is supplied to the upper electrode in the (c). During a period in which the (c) is performed, an impedance of the impedance circuit is set such that an impedance of a first electrical path is higher than an impedance of a second electrical path. The first electrical path is an electrical path from the lower electrode through the impedance circuit to the ground. The second electrical path is an electrical path from a wall of the chamber to the ground.

In one exemplary embodiment, during a period in which the (c) is performed, an impedance of a second impedance circuit may be set such that an impedance of a third electrical path is lower than the impedance of the first electrical path. The third electrical path is an electrical path from a ring electrode through the second impedance circuit to the ground.

In one exemplary embodiment, during a period in which the (c) is performed, the impedance of the second impedance circuit may be set to maximize a current value in the third electrical path measured by a current sensor.

In one exemplary embodiment, the gas supplied into the chamber in the (b) may be a film forming gas. In other words, the plasma processing method may be a film forming method.

Various exemplary embodiments are described in detail below with reference to the accompanying drawings. The same reference numeral is attached to a part which is the same or equivalent in each drawing.

Figure 1:
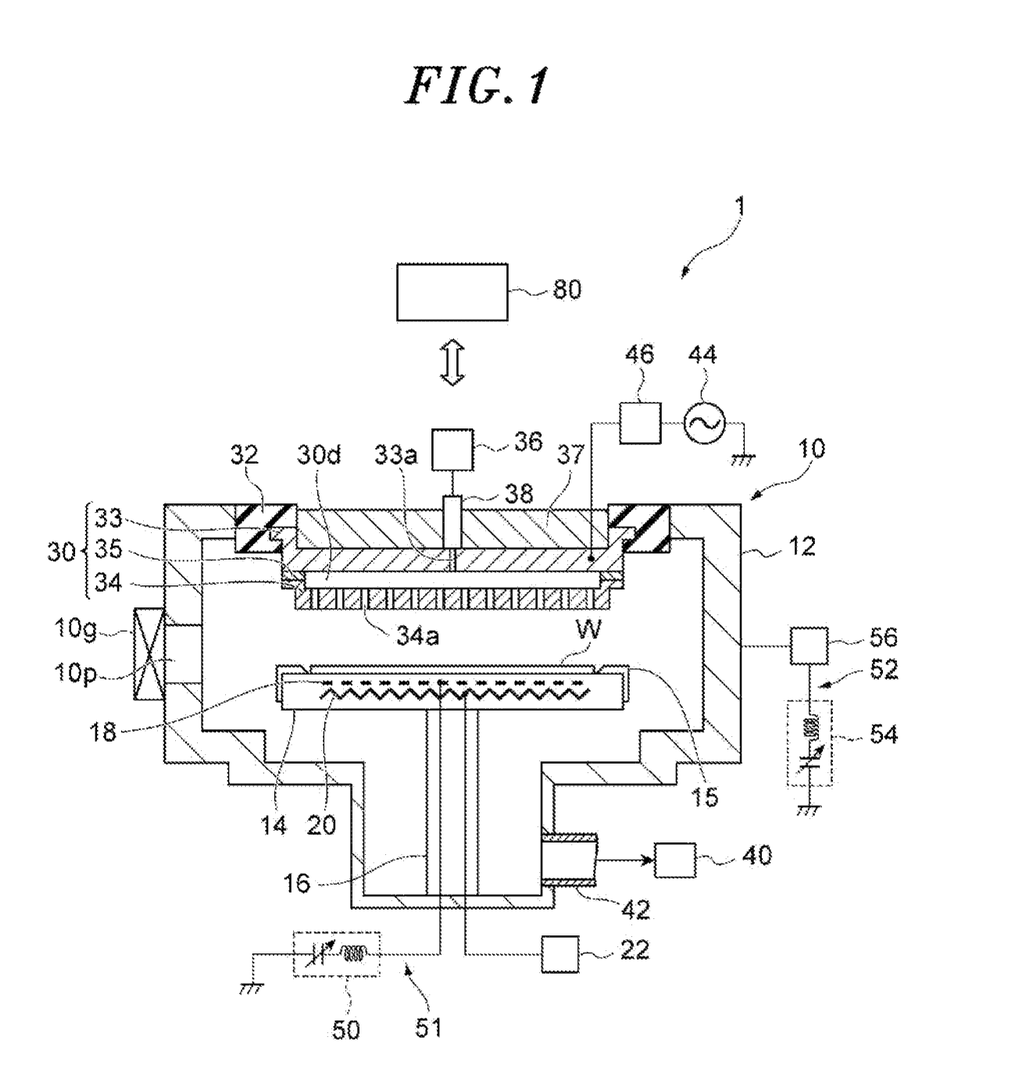
FIG. 1 is a diagram schematically showing a plasma processing apparatus according to one exemplary embodiment.

FIG. 1 is a diagram schematically showing a plasma processing apparatus according to one exemplary embodiment. The plasma processing apparatus shown in FIG. 1 includes a chamber 10. The chamber 10 provides an inner space therein. The chamber 10 may include a chamber body 12. The chamber body 12 has a substantially cylindrical shape. Walls, including sidewalls, of the chamber 10 are provided by the chamber body 12. The inner space of the chamber 10 is provided within the chamber body 12. The chamber body 12 is formed from metals such as aluminum. The chamber body 12 may be electrically grounded.

The chamber 10 provides a passage 10p in its sidewall. A substrate W processed in the plasma processing apparatus 1 passes through the passage 10p when transferred between the inside and outside of the chamber 10. A gate valve 10g is provided along the sidewall of the chamber 10 for opening and closing the passage 10p.

The plasma processing apparatus 1 further includes a substrate support 14. The substrate support 14 is provided within the chamber 10. The substrate support 14 is configured to support the substrate W placed thereon. The substrate support 14 has a main body. The main body of the substrate support 14 is made of, for example, aluminum nitride, and may have a disc shape. A guide ring 15 may be provided on an outer edge of the main body of the substrate support 14. The substrate support 14 may be supported by a support member 16. The support member 16 extends upwardly from a bottom of the chamber 10. The support member 16 may have a cylindrical shape.

The substrate support 14 includes a lower electrode 18. The lower electrode 18 is embedded in the main body of the substrate support 14. The substrate support 14 may have a heater 20. The heater 20 is embedded in the main body of the substrate support 14. The heater 20 is a resistive heating element, and is made of, for example, a refractory metal such as molybdenum. The heater 20 is connected to a heater power supply 22. The heater power supply 22 is provided outside the chamber 10. The heater 20 heats the substrate W by receiving power from the heater power supply 22 and generating heat.

The plasma processing apparatus 1 further includes an upper electrode 30. The upper electrode 30 is provided above the substrate support 14. The upper electrode 30 constitutes a ceiling of the chamber 10. The upper electrode 30 is electrically separated from the chamber body 12. In one embodiment, the upper electrode 30 is fixed to an upper portion of the chamber body 12 via an insulating member 32.

In one embodiment, the upper electrode 30 is configured as a showerhead. The upper electrode 30 may include a base member 33 and a ceiling plate 34. The upper electrode 30 may further include an intermediate member 35. The base member 33, the ceiling plate 34, and the intermediate member 35 are conductive and made of, for example, aluminum. The base member 33 is provided above the ceiling plate 34. A heat insulating member 37 may be provided on the base member 33. The intermediate member 35 has a substantially ring shape, and is interposed between the base member 33 and the ceiling plate 34. The base member 33 and the ceiling plate 34 provide a gas diffusion space 30d therebetween. The base member 33 provides a gas introduction port 33a that connects to the gas diffusion space 30d. The ceiling plate 34 provides a plurality of gas holes 34a. The plurality of gas holes 34a extend downward from the gas diffusion space 30d and penetrate the ceiling plate 34 along its thickness direction.

The plasma processing apparatus 1 further includes a gas supply 36. The gas supply 36 is configured to supply a gas into the chamber 10. In one embodiment, the gas supply 36 is connected to the gas introduction port 33a via a pipe 38. The gas supply 36 may have one or more gas sources, one or more flow controllers, and one or more on-off valves. Each of the one or more gas sources is connected to the gas introduction port 33a via a corresponding flow controller and a corresponding on-off valve.

In one embodiment, the gas supply 36 may supply a film forming gas. In other words, the plasma processing apparatus 1 may be a film forming apparatus. The film formed on the substrate W using the film forming gas may be an insulating film or a dielectric film. In another embodiment, the gas supply 36 may supply an etching gas. In other words, the plasma processing apparatus 1 may be a plasma etching apparatus.

The plasma processing apparatus 1 further includes an exhaust device 40. The exhaust device 40 includes a pressure controller, such as an automatic pressure control valve, and a vacuum pump, such as a turbomolecular pump or a dry pump. The exhaust device 40 is connected to an exhaust pipe 42. The exhaust pipe 42 is connected to the bottom of the chamber 10 and communicates with the inner space of the chamber 10. The exhaust pipe 42 may be connected to the sidewall of the chamber 10.

The plasma processing apparatus 1 further includes a high-frequency power supply 44. The high-frequency power supply 44 generates high-frequency power. The frequency of the high-frequency power is less than 13.56 MHz. The frequency of the high-frequency power may be 2 MHz or less. The frequency of the high-frequency power may be 200 kHz or higher.

The high-frequency power supply 44 is connected to the upper electrode 30 via a matching device 46. The matching device 46 has a matching circuit that matches an impedance of a load of the high-frequency power supply 44 with an output impedance of the high-frequency power supply 44.

The plasma processing apparatus 1 further includes an impedance circuit 50. The impedance circuit 50 is connected between the lower electrode 18 and the ground. The impedance circuit 50 may provide a variable impedance between the lower electrode 18 and the ground. The impedance circuit 50 may include a series circuit of an inductor and a capacitor. The inductor may be a variable inductor and the capacitor may be a variable capacitor.

The impedance of the impedance circuit 50 is set such that an impedance of an electrical path 51 from the lower electrode 18 to the ground through the impedance circuit 50 is higher than an impedance of an electrical path 52 from the wall of the chamber 10 to the ground. The impedance of the impedance circuit 50 can be set by a controller 80, which will be described later.

In one embodiment, the plasma processing apparatus 1 may further include an impedance circuit 54. The impedance circuit 54 is connected between the wall of the chamber 10 and the ground. In other words, in one embodiment, the electrical path 52 includes the impedance circuit 54. The impedance circuit 54 may provide a variable impedance between the wall of the chamber 10 and the ground. The impedance circuit 54 may include a series circuit of an inductor and a capacitor. The inductor may be a variable inductor and the capacitor may be a variable capacitor.

An impedance of the impedance circuit 54 is set such that the impedance of the electrical path 52 is lower than the impedance of the electrical path 51. The impedance of the impedance circuit 54 may be set by the controller 80.

In one embodiment, the plasma processing apparatus 1 may further include a current sensor 56. The current sensor 56 is configured to measure a current value in the electrical path 52. If the wall of the chamber 10 is directly grounded, the plasma processing apparatus 1 may not include the impedance circuit 54 and the current sensor 56.

The plasma processing apparatus 1 further includes the controller 80. The controller 80 is configured to control each component of the plasma processing apparatus 1. The controller 80 may be a computer including a processor, a storage such as a memory, an input device, a display device, a signal input/output interface, or the like. The storage of the controller 80 stores a control program and recipe data. The processor of the controller 80 executes the control program and controls each component of the plasma processing apparatus 1 according to the recipe data. By controlling each component of the plasma processing apparatus 1 by the controller 80, plasma processing methods according to various exemplary embodiments are executed in the plasma processing apparatus 1.

The controller 80 controls the gas supply 36 and the exhaust device 40 so that gas pressure in the chamber 10 is 26.66 Pa (200 mTorr) or higher. The controller 80 controls the high-frequency power supply 44 to supply high-frequency power to the upper electrode 30. Since the plasma processing apparatus 1 uses high-frequency power having a frequency lower than 13.56 MHz, it is possible to generate a high-density plasma in the high-pressure chamber 10 of 26.66 Pa (200 mTorr) or higher.

Further, the impedance of the impedance circuit 50 is set such that the impedance of the electrical path 51 is higher than the impedance of the electrical path 52. Therefore, in the plasma processing apparatus 1, electrical coupling between the upper electrode 30 and the lower electrode 18 is weakened by the impedance circuit 50. Accordingly, the current flowing through the lower electrode 18 is reduced, and the energy applied to the substrate W on the substrate support 14 is reduced.

In one embodiment, the controller 80 can control the impedance of the impedance circuit 54 to maximize the current value of the current sensor 56. In accordance with this embodiment, even if a film such as an insulating film or a dielectric film is formed on a wall surface of the chamber 10, the current flowing through the lower electrode 18 is suppressed. Therefore, the energy applied to the substrate W on the substrate support 14 is reduced.

Figure 2:
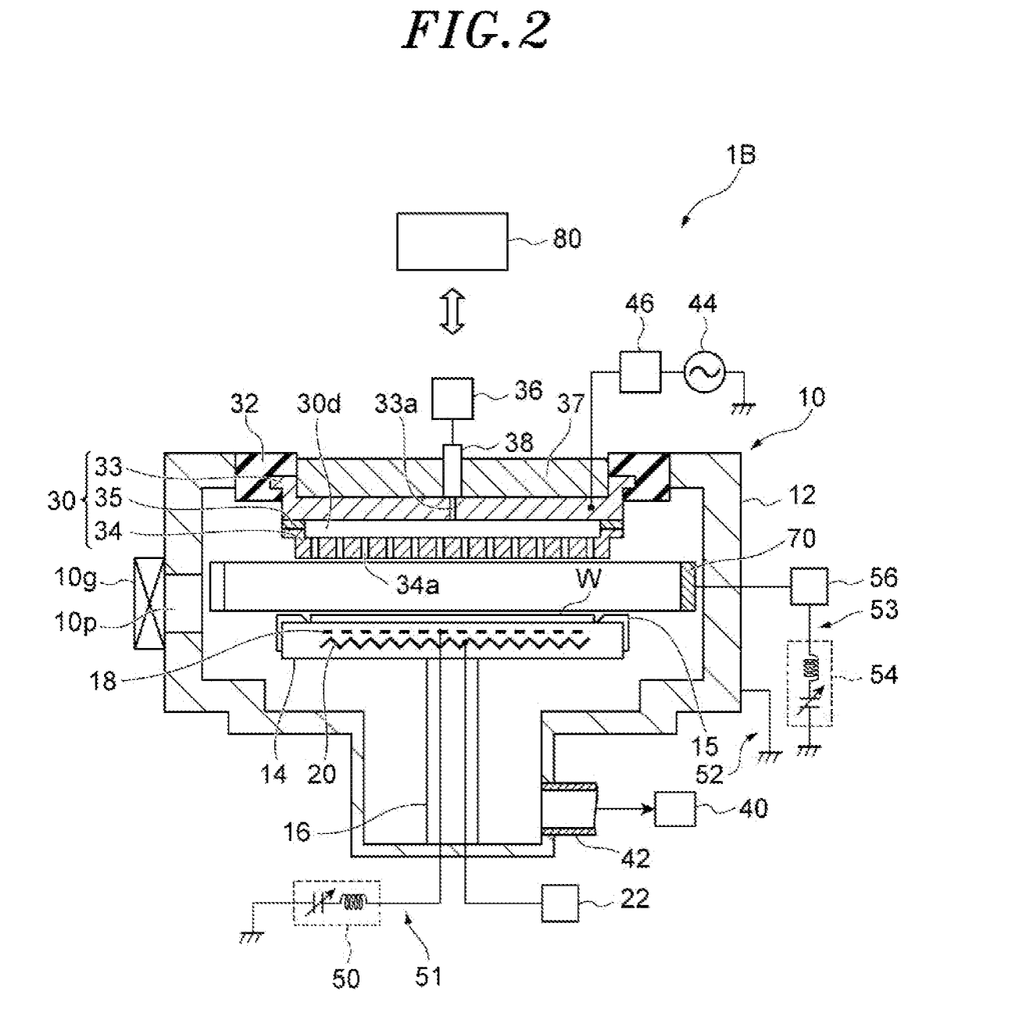
FIG. 2 is a diagram schematically showing a plasma processing apparatus according to another exemplary embodiment.

A plasma processing apparatus according to another exemplary embodiment will be described below with reference to FIG. 2. FIG. 2 is a diagram schematically showing a plasma processing apparatus according to another exemplary embodiment. Differences between a plasma processing apparatus 1B shown in FIG. 2 and the plasma processing apparatus 1 will be described below.

The plasma processing apparatus 1B further includes a ring electrode 70. The ring electrode 70 has a ring shape. The ring electrode 70 is provided outside the space between the lower electrode 18 and the upper electrode 30 and in the chamber 10. In the plasma processing apparatus 1B, the ring electrode 70 extends along the sidewall of the chamber 10 (or the chamber body 12). When the exhaust pipe 42 is connected to the sidewall of the chamber 10, the ring electrode 70 may be a mesh electrode providing a plurality of holes.

In the plasma processing apparatus 1B, the impedance circuit 54 is connected between the ring electrode 70 and the ground. The impedance circuit 54 may provide a variable impedance between the ring electrode 70 and the ground. The impedance of the impedance circuit 54 is set such that an impedance of an electrical path 53 from the ring electrode 70 to the ground through the impedance circuit 54 is lower than the impedance of the electrical path 51. In the plasma processing apparatus 1B, the electrical path 52 directly connects the wall of the chamber 10 to the ground.

In the plasma processing apparatus 1B, the current sensor 56 is configured to measure a current value in the electrical path 53. Also in the plasma processing apparatus 1B, the controller 80 can control the impedance of the impedance circuit 54 to maximize the current value of the current sensor 56. In this embodiment, even if a film such as an insulating film or a dielectric film is formed on a surface of the ring electrode 70, the current flowing through the lower electrode 18 is suppressed. Therefore, the energy applied to the substrate W on the substrate support 14 is reduced.

Figure 3:
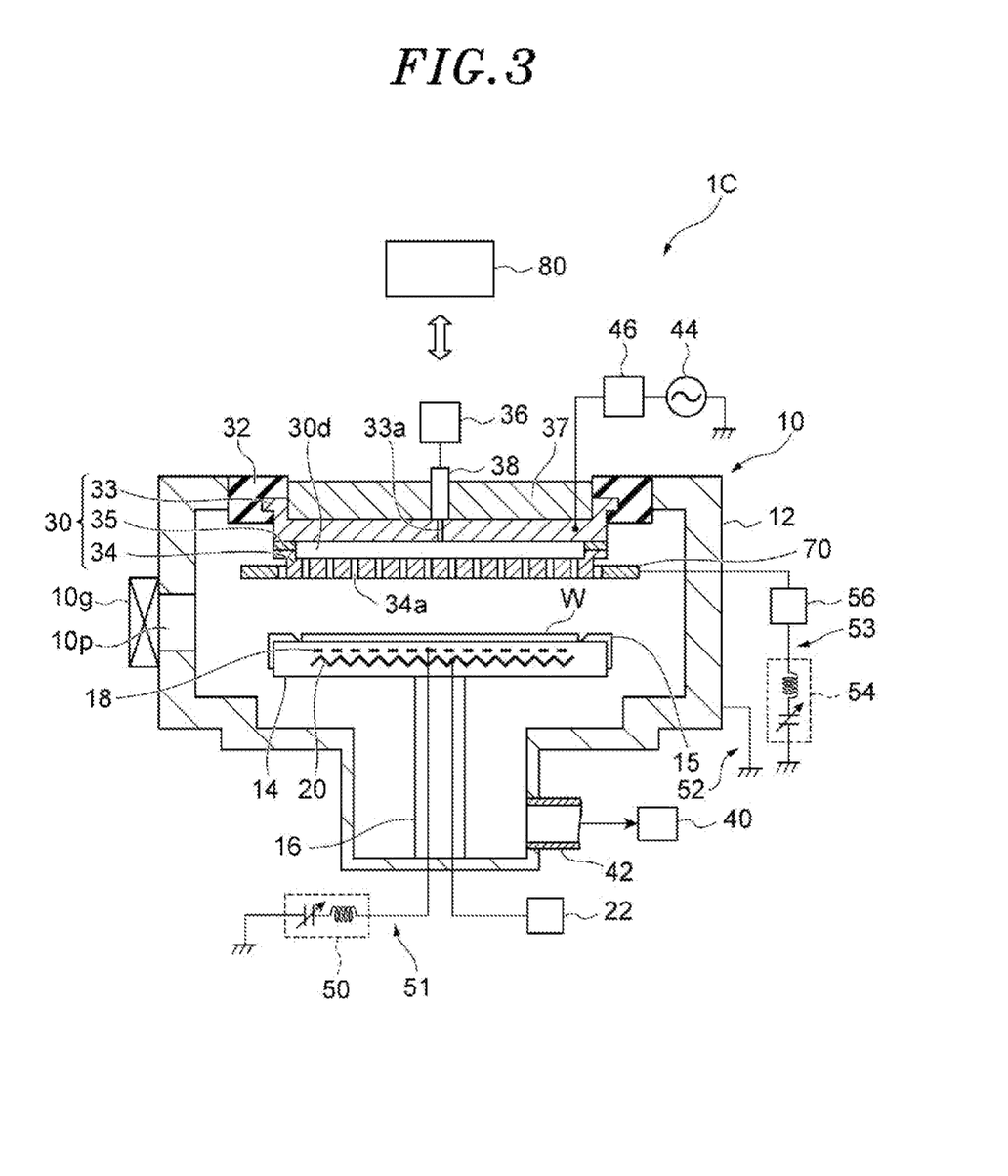
FIG. 3 is a diagram schematically showing a plasma processing apparatus according to still another exemplary embodiment.

A plasma processing apparatus according to another exemplary embodiment will be described below with reference to FIG. 3. FIG. 3 is a diagram schematically showing a plasma processing apparatus according to still another exemplary embodiment. A plasma processing apparatus 1C shown in FIG. 3 differs from the plasma processing apparatus 1B in that the ring electrode 70 extends to surround the upper electrode 30. In the plasma processing apparatus 1C, the ring electrode 70 may surround the ceiling plate 34. Other configurations of the plasma processing apparatus 10 may be similar to other configurations of the plasma processing apparatus 1B.

Figure 4:
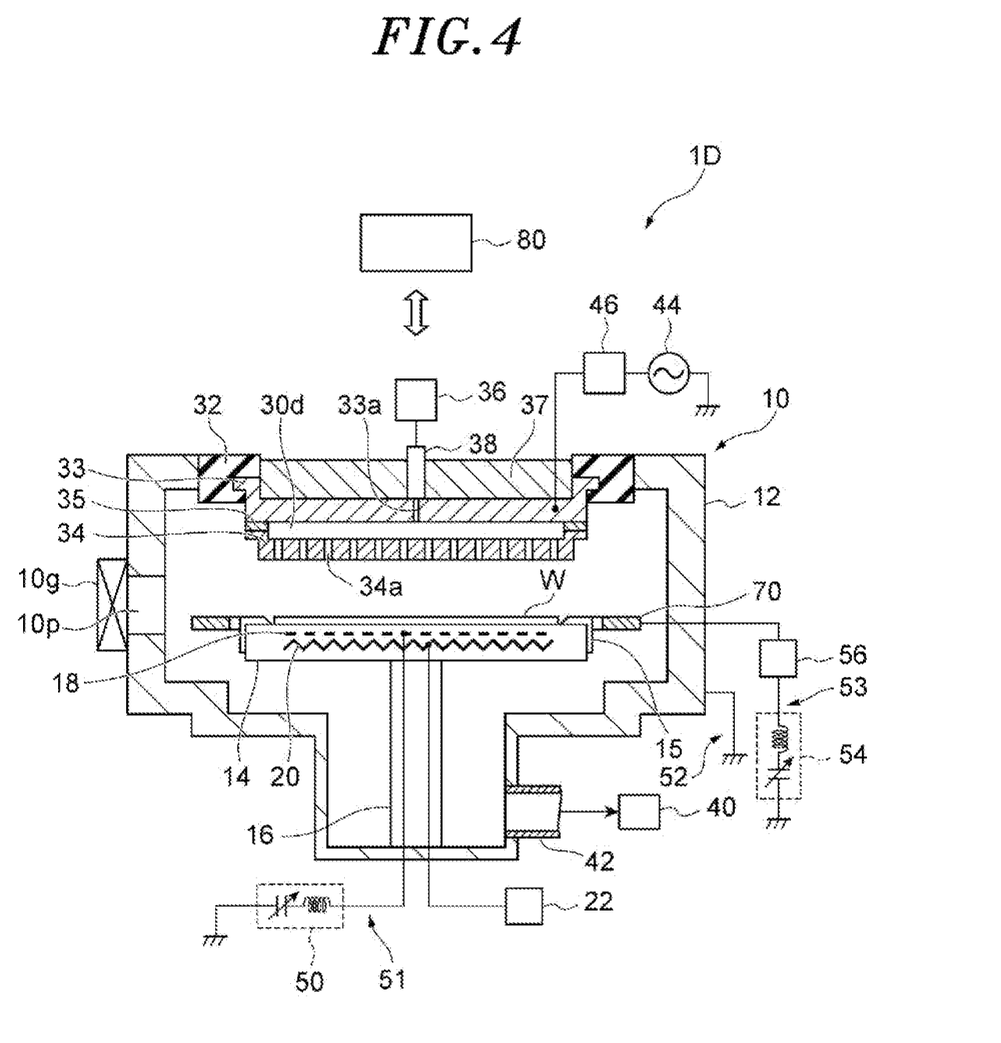
FIG. 4 is a diagram schematically showing a plasma processing apparatus according to further still another exemplary embodiment.

A plasma processing apparatus according to another exemplary embodiment will be described below with reference to FIG. 4. FIG. 4 is a diagram schematically showing a plasma processing apparatus according to further still another exemplary embodiment. A plasma processing apparatus 1D shown in FIG. 4 differs from the plasma processing apparatus 1B in that the ring electrode 70 extends to surround the substrate support 14. Other configurations of the plasma processing apparatus 1D may be similar to other configurations of the plasma processing apparatus 1B.

A plasma processing method performed using the plasma processing apparatus of any one of the various exemplary embodiments described above will be described below.

The plasma processing method includes step (a). In step (a), the substrate W is provided on the substrate support 14 in the chamber 10.

In subsequent step (b), the pressure of the gas in the chamber is set to a pressure of 26.66 Pa (200 mTorr) or higher. In step (b), the gas is supplied from the gas supply 36 into the chamber 10. The gas may be a film forming gas, as described above, or an etching gas. The pressure of the gas in the chamber 10 is regulated by the gas supply 36 and the exhaust device 40.

Step (c) is performed during step (b). In other words, step (c) is performed in a state where the pressure of the gas in the chamber 10 is set to 26.66 Pa (200 mTorr) or higher. In step (c), the high-frequency power is supplied from the high-frequency power supply 44 to the upper electrode 30. The high-frequency power has a frequency lower than 13.56 MHz. The frequency of the high-frequency power may be 2 MHz or less. Further, the frequency of the high-frequency power may be 200 kHz or higher. A high-density plasma is generated in the high-pressure chamber 10 by step (c).

The impedance of the electrical path 51 including the impedance circuit 50 is higher than the impedance of the electrical path 52. Therefore, the current flowing through the lower electrode 18 is reduced, and the energy applied to the substrate W on the substrate support 14 is reduced.

In the case of using the plasma processing apparatus 1, the impedance of the impedance circuit 54 may be controlled to maximize the current value of the current sensor 56 during step (c). In this case, even if a film such as an insulating film or a dielectric film is formed on the wall surface of the chamber 10, the current flowing through the lower electrode 18 is suppressed. Therefore, the energy applied to the substrate W on the substrate support 14 is reduced.

In the case of using the plasma processing apparatus 1B, 10, or 1D, the impedance of the electrical path 51 including the impedance circuit 50 is higher than the impedance of the electrical path 53. Therefore, the current flowing through the lower electrode 18 is reduced, and the energy applied to the substrate W on the substrate support 14 is reduced.

Also in the case of using the plasma processing apparatus 1B, 10, or 1D, during step (c), the impedance of the impedance circuit 54 may be controlled to maximize the current value of the current sensor 56. In this case, even if a film such as an insulating film or a dielectric film is formed on the surface of the ring electrode 70, the current flowing through the lower electrode 18 is suppressed. Therefore, the energy applied to the substrate W on the substrate support 14 is reduced.

While various exemplary embodiments have been described above, various additions, omissions, substitutions, and modifications may be made without being limited to the exemplary embodiments described above. Further, elements from different embodiments can be combined to form other embodiments.

Experiments performed using the plasma processing apparatus 1 will be described below. The experiments described below do not limit the present disclosure.

First Experiment

Figure 5:
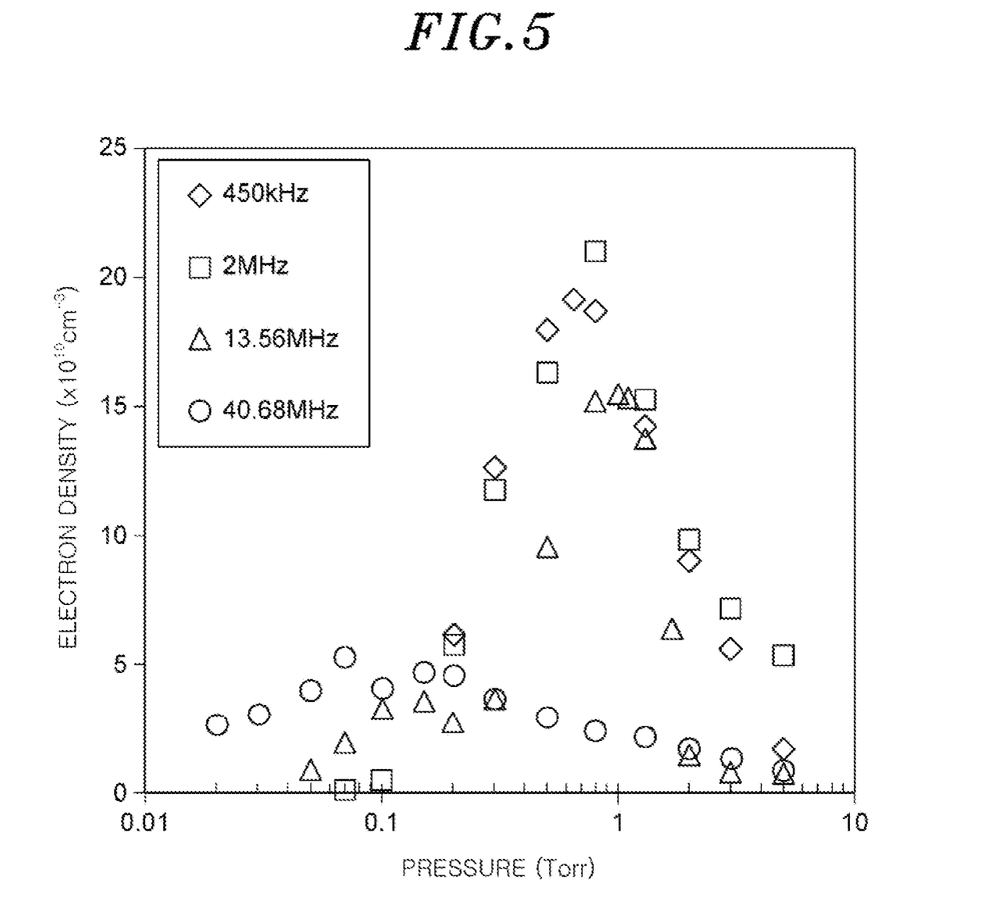
FIG. 5 is a graph showing results of a first experiment.

In a first experiment, a plasma was generated in the chamber 10 of the plasma processing apparatus 1 using different combinations of the frequencies of the high-frequency power and the pressures of the gas in the chamber 10. The frequencies of the high-frequency power used in the first experiment were 450 kHz, 2 MHz, 13.56 MHz, and 40.68 MHz. In the first experiment, a plasma absorption probe was used to measure the electron density in the plasma within the chamber 10. Other conditions in the first experiment are shown below.

Conditions of the First Experiment

Gas supplied into the chamber 10: mixed gas of argon gas and oxygen gas

High-frequency power: 500 W

FIG. 5 shows the results of the first experiment. In the graph of FIG. 5, the horizontal axis indicates the pressure of the gas in the chamber 10 in the first experiment, and the vertical axis indicates the electron density. As shown in FIG. 5, when the pressure of the gas in the chamber was set to a high pressure of 200 mTorr (26.66 Pa) or higher, high electron density was obtained using high-frequency power having a frequency lower than 13.56 MHz. In other words, it was confirmed that a high-density plasma can be generated by using high-frequency power having a frequency lower than 13.56 MHz when the pressure of the gas in the chamber 10 is set to a high pressure of 200 mTorr (26.66 Pa) or higher.

Second Experiment

Figure 6:
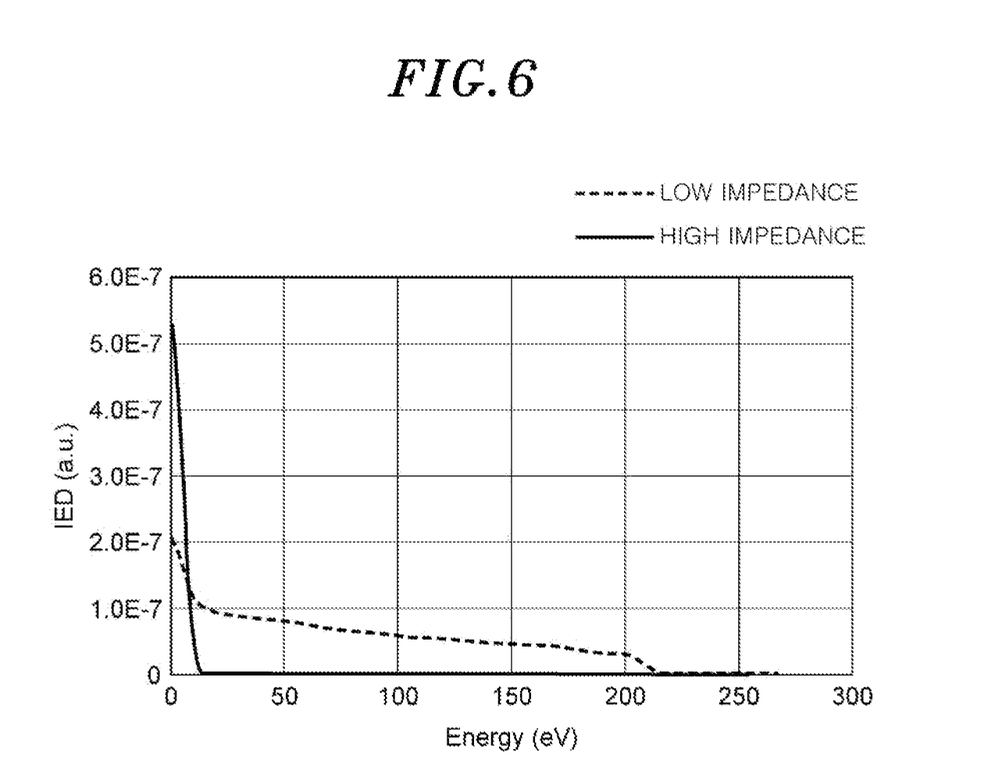
FIG. 6 is a graph showing two ion energy distributions obtained in a second experiment.

In a second experiment, a plasma was generated in the chamber 10 of the plasma processing apparatus 1 under two conditions of high impedance and low impedance of the impedance circuit 50. In the second experiment, the ion energy distribution (IED) of the plasma on the substrate was determined. Other conditions in the second experiment are shown below.

Conditions of the Second Experiment

Gas supplied into the chamber 10: mixed gas of argon gas and oxygen gas
   Pressure of gas in the chamber 10: 500 mTorr (66.66 Pa)
   High-frequency power: 450 kHz and 800 W FIG. 6 shows two ion energy distributions obtained in the second experiment. In FIG. 6, the dotted line indicates the ion energy distribution in the case where the impedance of the impedance circuit 50 is low. In FIG. 6, the solid line indicates the ion energy distribution in the case where the impedance of the impedance circuit 50 is high. It was confirmed that when the impedance of the impedance circuit 50 is low, the ions supplied to the substrate have high energy, as indicated by the dotted line in FIG. 6. On the other hand, it was confirmed that when the impedance of the impedance circuit 50 is high, the ions supplied to the substrate have low energy, as indicated by the solid line in FIG. 6.

Third Experiment

Figure 7:
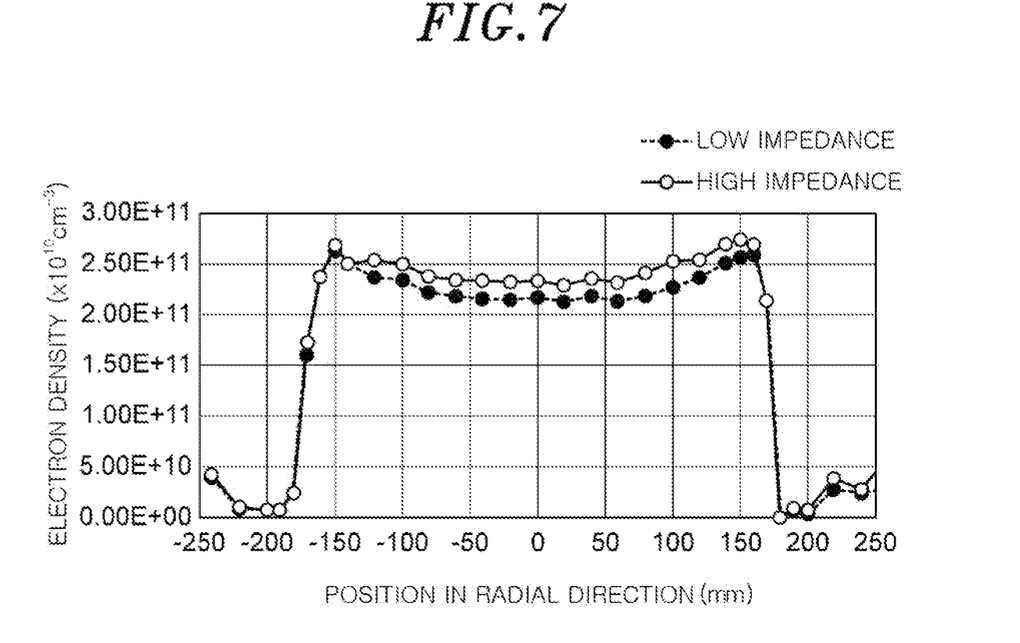
FIG. 7 is a graph showing two electron density distributions obtained in a third experiment.

In a third experiment, similarly to the second experiment, a plasma was generated in the chamber 10 of the plasma processing apparatus 1 under two conditions, when the impedance of the impedance circuit 50 was high and when it was low. In the third experiment, the electron density in the plasma was measured using a plasma absorption probe to obtain the electron density distribution in the plasma. Other conditions in the third experiment are shown below.

Conditions of the Third Experiment

Gas supplied into the chamber 10: mixed gas of argon gas and oxygen gas
   Pressure of gas in the chamber 10: 500 mTorr (66.66 Pa)
   High-frequency power: 450 kHz and 800 W FIG. 7 shows two electron density distributions obtained in the third experiment. In FIG. 7, the horizontal axis indicates the position in the radial direction with the position on the center of the substrate W (the position of 0 mm) as a reference. In FIG. 7, the dotted line indicates the electron density distribution in the case where the impedance of the impedance circuit 50 is low. In FIG. 7, the solid line indicates the electron density distribution in the case where the impedance of the impedance circuit 50 is high. As shown in FIG. 7, in the case of using high-frequency power having a relatively low frequency such as a frequency lower than 13.56 MHz, the radial distribution of the electron density in the plasma was substantially uniform without depending on the impedance of the impedance circuit 50.

From the above description, it will be appreciated that various embodiments of the present disclosure have been described herein for purpose of illustration, and that various changes may be made without departing from the scope and spirit of the present disclosure. Therefore, the various embodiments disclosed herein are not intended to be limiting, with a true scope and spirit being indicated by the following claims.

DESCRIPTION OF REFERENCE NUMERALS

1: plasma processing apparatus, 10: chamber, 14: substrate support, 18: lower electrode, 30: upper electrode, 36: gas supply, 40: exhaust device, 44: high-frequency power supply, 50: impedance circuit

The invention claimed is:

1. A plasma processing apparatus comprising:
a chamber;
a gas supply configured to supply a gas into the chamber;
an exhaust device configured to exhaust a gas in the chamber;
a substrate support including a lower electrode and provided in the chamber;
an upper electrode provided above the substrate support;
a high-frequency power supply configured to supply high-frequency power to the upper electrode;
an impedance circuit connected between the lower electrode and ground; and
a controller configured to control the gas supply and the exhaust device such that a pressure of the gas in the chamber is 26.66 Pa or higher,
wherein a frequency of the high-frequency power is lower than 13.56 MHz, and
an impedance of the impedance circuit is set such that an impedance of an electrical path from the lower electrode through the impedance circuit to the ground is higher than an impedance of an electrical path from a wall of the chamber to the ground.

2. The plasma processing apparatus of claim 1, further comprising:
a ring electrode having a ring shape and provided outside a space between the lower electrode and the upper electrode and inside the chamber; and
a second impedance circuit that is different from a first impedance circuit that is the impedance circuit connected between the lower electrode and the ground, and that is connected between the ring electrode and the ground,
wherein an impedance of the second impedance circuit is set such that an impedance of an electrical path from the ring electrode through the second impedance circuit to the ground is lower than the impedance of the electrical path from the lower electrode through the first impedance circuit to the ground.

3. The plasma processing apparatus of claim 2, further comprising:
a current sensor that measures a current value in the electrical path from the ring electrode through the second impedance circuit to the ground,
wherein the controller sets the impedance of the second impedance circuit to maximize the current value measured by the current sensor.

4. The plasma processing apparatus of claim 2, wherein the ring electrode extends along a sidewall of the chamber.

5. The plasma processing apparatus of claim 2, wherein the ring electrode extends to surround the upper electrode.

6. The plasma processing apparatus of claim 2, wherein the ring electrode extends to surround the substrate support.

7. The plasma processing apparatus of claim 1, wherein the frequency of the high-frequency power is 2 MHz or less.

8. The plasma processing apparatus of claim 1, wherein the gas supply is configured to supply a film forming gas.

9. A plasma processing method comprising:
(a) preparing a substrate on a substrate support in a chamber of a plasma processing apparatus, the substrate support including a lower electrode;
(b) supplying a gas into the chamber, a pressure of the gas in the chamber being set to a pressure of 26.66 Pa or higher; and
(c) supplying high-frequency power to an upper electrode, the upper electrode being provided above the substrate support;
wherein in a state where the pressure of the gas in the chamber is set to 26.66 Pa or higher in the (b), the high-frequency power having a frequency lower than 13.56 MHz is supplied to the upper electrode in the (c), and
during a period in which the (c) is performed, an impedance of an impedance circuit connected between the lower electrode and ground is set such that an impedance of an electrical path from the lower electrode through the impedance circuit to the ground is higher than an impedance of an electrical path from a wall of the chamber to the ground.

10. The plasma processing method of claim 9, wherein the plasma processing apparatus further comprises:
a ring electrode having a ring shape and provided outside a space between the lower electrode and the upper electrode and inside the chamber; and
a second impedance circuit that is different from a first impedance circuit that is the impedance circuit connected between the lower electrode and the ground, and that is connected between the ring electrode and the ground,
wherein during a period in which the (c) is performed, an impedance of the second impedance circuit is set such that an impedance of an electrical path from the ring electrode through the second impedance circuit to the ground is lower than the impedance of the electrical path from the lower electrode through the first impedance circuit to the ground.

11. The plasma processing method of claim 10, wherein the plasma processing apparatus further comprises a current sensor that measures a current value in the electrical path from the ring electrode through the second impedance circuit to the ground, and
during a period in which the (c) is performed, the impedance of the second impedance circuit is set to maximize the current value measured by the current sensor.

12. The plasma processing method of claim 10, wherein the ring electrode extends along a sidewall of the chamber.

13. The plasma processing method of claim 10, wherein the ring electrode extends to surround the upper electrode.

14. The plasma processing method of claim 10, wherein the ring electrode extends to surround the substrate support.

15. The plasma processing method of claim 9, wherein the frequency of the high-frequency power is 2 MHz or less.

16. The plasma processing method of claim 9, wherein the gas supplied into the chamber in the (b) is a film forming gas.

* * * * *